United States Patent
Yung et al.

(10) Patent No.: US 9,896,566 B2
(45) Date of Patent: Feb. 20, 2018

(54) LASER ACTIVATABLE POLYMER COMPOSITION

(71) Applicant: Ticona LLC, Florence, KY (US)

(72) Inventors: Paul C. Yung, Cincinnati, OH (US); Michael Schaefer, Maintal (DE)

(73) Assignee: Ticona LLC, Florence, KY (US)

( * ) Notice: Subject to any disclaimer, the term of this patent is extended or adjusted under 35 U.S.C. 154(b) by 0 days.

(21) Appl. No.: 14/753,055

(22) Filed: Jun. 29, 2015

(65) Prior Publication Data

US 2016/0053072 A1 Feb. 25, 2016

Related U.S. Application Data

(60) Provisional application No. 62/019,561, filed on Jul. 1, 2014, provisional application No. 62/040,526, filed on Aug. 22, 2014.

(51) Int. Cl.

| | | |
|---|---|---|
| *C08K 3/10* | (2006.01) | |
| *C08K 3/34* | (2006.01) | |
| *C08K 7/10* | (2006.01) | |
| *H05K 1/03* | (2006.01) | |
| *C08K 3/32* | (2006.01) | |
| *C08K 3/40* | (2006.01) | |
| *C08K 3/30* | (2006.01) | |
| *H05K 1/16* | (2006.01) | |

(Continued)

(52) U.S. Cl.
CPC ............... *C08K 3/10* (2013.01); *C08K 3/30* (2013.01); *C08K 3/32* (2013.01); *C08K 3/34* (2013.01); *C08K 3/40* (2013.01); *C08K 7/10* (2013.01); *H05K 1/0373* (2013.01); *C08K 2003/3045* (2013.01); *C08K 2003/325* (2013.01); *H05K 1/0366* (2013.01); *H05K 1/165* (2013.01); *H05K 3/106* (2013.01); *H05K 3/185* (2013.01); *H05K 2201/0141* (2013.01); *H05K 2201/0209* (2013.01); *H05K 2201/0236* (2013.01); *H05K 2201/0266* (2013.01); *H05K 2201/10098* (2013.01)

(58) Field of Classification Search
None
See application file for complete search history.

(56) References Cited

U.S. PATENT DOCUMENTS 4,161,470 A 7/1979 Calundann
4,251,436 A * 2/1981 Silberberg ............. B82Y 30/00
106/462

(Continued)

FOREIGN PATENT DOCUMENTS

EP 1 178 072 A2 2/2002
EP 1 178 072 A3 2/2002

(Continued)

OTHER PUBLICATIONS

Abstract of Japanese Patent—JPH11181284, Jul. 6, 1999, 2 pages.

(Continued)

*Primary Examiner* — Katie L Hammer
(74) *Attorney, Agent, or Firm* — Dority & Manning, P.A.

(57) ABSTRACT

A polymer composition that comprises an aromatic polyester, a laser activatable additive, and a mineral filler is provided. The mineral filler has a median size of about 35 micrometers or less and the laser activatable additive has a mean size of about 1000 nanometers or less.

25 Claims, 2 Drawing Sheets

(51) Int. Cl.
*H05K 3/10* (2006.01)
*H05K 3/18* (2006.01)

(56) References Cited

U.S. PATENT DOCUMENTS

| | | | |
|---|---|---|---|
| 4,368,286 A | 1/1983 | Hayashi et al. |
| 4,664,972 A | 5/1987 | Connolly |
| 4,772,509 A | 9/1988 | Komada et al. |
| 4,797,465 A | 1/1989 | Portugall et al. |
| 4,851,496 A | 7/1989 | Poll et al. |
| 4,857,626 A | 8/1989 | Kishiro et al. |
| 5,177,173 A | 1/1993 | Iwakiri et al. |
| 5,278,254 A | 1/1994 | Furuta et al. |
| 5,508,374 A | 4/1996 | Lee et al. |
| 5,576,073 A | 11/1996 | Kickelhain |
| 5,616,680 A | 4/1997 | Linstid, III |
| 5,630,272 A | 5/1997 | Wenke |
| 5,750,212 A | 5/1998 | Kickelhain |
| 5,759,674 A | 6/1998 | Furuta et al. |
| 5,767,223 A | 6/1998 | Yamada et al. |
| 5,856,572 A | 1/1999 | Liou et al. |
| 6,093,636 A | 7/2000 | Carter et al. |
| 6,114,492 A | 9/2000 | Linstid, III et al. |
| 6,121,495 A | 9/2000 | Babb et al. |
| 6,403,211 B1 | 6/2002 | Yang et al. |
| 6,433,071 B1 | 8/2002 | Arai et al. |
| 6,514,611 B1 | 2/2003 | Shepherd et al. |
| 6,538,211 B2 | 3/2003 | St. Lawrence et al. |
| 6,602,583 B2 | 8/2003 | St. Lawrence et al. |
| 6,616,796 B1 | 9/2003 | Onodera et al. |
| 6,696,163 B2 | 2/2004 | Yang |
| 6,696,173 B1 | 2/2004 | Naundorf et al. |
| 6,797,345 B2 | 9/2004 | Okamoto et al. |
| 6,838,546 B2 | 1/2005 | Okamoto et al. |
| 6,923,919 B2 | 8/2005 | Yang et al. |
| 6,994,896 B2 | 2/2006 | Sethumadhavan et al. |
| 7,022,413 B2 | 4/2006 | Katagiri et al. |
| 7,022,807 B2 | 4/2006 | Okamoto et al. |
| 7,052,574 B2 | 5/2006 | Onodera et al. |
| 7,060,421 B2 | 6/2006 | Naundorf et al. |
| 7,063,892 B2 | 6/2006 | Okamoto et al. |
| 7,083,848 B2 | 8/2006 | Kliesch et al. |
| 7,112,365 B2 | 9/2006 | Kliesch et al. |
| 7,211,527 B2 | 5/2007 | Okamoto et al. |
| 7,211,528 B2 | 5/2007 | Katagiri et al. |
| 7,227,179 B2 | 6/2007 | St. Lawrence et al. |
| 7,550,093 B2 | 6/2009 | Seo et al. |
| 7,816,014 B2 | 10/2010 | Ito et al. |
| 7,862,745 B2 | 1/2011 | Tano et al. |
| 7,883,780 B2 | 2/2011 | Okamoto et al. |
| 7,887,887 B2 | 2/2011 | Cho et al. |
| 8,101,248 B2 | 1/2012 | Yun et al. |
| 8,168,082 B2 | 5/2012 | Matsuda et al. |
| 8,323,802 B2 | 12/2012 | Dunbar et al. |
| 8,465,670 B2 | 6/2013 | Kondo et al. |
| 8,492,464 B2 | 7/2013 | Li et al. |
| 8,623,449 B2 | 1/2014 | Ito et al. |
| 8,803,744 B2 | 8/2014 | Jia et al. |
| 8,821,755 B2 | 9/2014 | Uehara |
| 8,865,821 B2 | 10/2014 | Stoppelmann et al. |
| 8,933,161 B2 | 1/2015 | Takano et al. |
| 9,074,070 B2 | 7/2015 | Yung et al. |
| 9,145,469 B2 | 9/2015 | Nair et al. |
| 2002/0081443 A1 | 6/2002 | Connelly et al. |
| 2003/0207048 A1 | 11/2003 | St. Lawrence et al. |
| 2003/0212187 A1* | 11/2003 | Cottis ............... C08K 3/22 524/492 |
| 2004/0091686 A1 | 5/2004 | Okamoto et al. |
| 2004/0192858 A1 | 9/2004 | Katagiri et al. |
| 2007/0295689 A1* | 12/2007 | Clauss ............... B41M 5/267 216/65 |
| 2009/0229750 A1 | 9/2009 | Ito et al. |
| 2009/0292051 A1* | 11/2009 | Li ............... C08K 3/0008 524/404 |
| 2009/0298295 A1 | 12/2009 | Kikuyama et al. |
| 2009/0324929 A1 | 12/2009 | Yamakawa et al. |
| 2010/0009067 A1 | 1/2010 | Inoue et al. |
| 2010/0203326 A1 | 8/2010 | Ok |
| 2010/0236820 A1 | 9/2010 | Suh |
| 2010/0263919 A1 | 10/2010 | Lee et al. |
| 2010/0308304 A1* | 12/2010 | Ogier ............... H01L 51/0541 257/40 |
| 2011/0014434 A1 | 1/2011 | Tanaka et al. |
| 2011/0229629 A1 | 9/2011 | Ito et al. |
| 2012/0135218 A1 | 5/2012 | Shim et al. |
| 2012/0164447 A1 | 5/2012 | Kohinata |
| 2012/0161357 A1 | 6/2012 | Miyakoshi et al. |
| 2012/0164316 A1 | 6/2012 | Kondo et al. |
| 2012/0183697 A1 | 7/2012 | Ito et al. |
| 2012/0193129 A1 | 8/2012 | Ito et al. |
| 2012/0193131 A1 | 8/2012 | Kusakawa et al. |
| 2012/0196043 A1 | 8/2012 | Azami |
| 2012/0196044 A1 | 8/2012 | Azami |
| 2012/0199999 A1 | 8/2012 | Shim et al. |
| 2012/0263882 A1 | 10/2012 | Okamoto et al. |
| 2012/0325534 A1 | 12/2012 | Ito et al. |
| 2012/0328872 A1 | 12/2012 | Ito et al. |
| 2013/0037313 A1 | 2/2013 | Miyakoshi et al. |
| 2013/0052336 A1 | 3/2013 | Miyakoshi et al. |
| 2013/0101824 A1 | 4/2013 | Shim et al. |
| 2013/0106659 A1* | 5/2013 | Yung ............... C08K 3/22 343/700 MS |
| 2013/0168133 A1 | 7/2013 | Schrauwen |
| 2014/0002311 A1* | 1/2014 | Takano ............... C08J 5/043 343/700 MS |
| 2014/0066560 A1* | 3/2014 | Stoppelmann ............... C08K 7/14 524/407 |
| 2014/0087149 A1 | 3/2014 | Nair et al. |
| 2014/0147682 A1 | 5/2014 | Takano et al. |
| 2014/0178654 A1 | 6/2014 | Nair et al. |
| 2014/0178705 A1 | 6/2014 | Nair et al. |
| 2014/0206800 A1 | 7/2014 | Wu et al. |
| 2015/0175805 A1 | 6/2015 | Schaefer |
| 2015/0274884 A1 | 10/2015 | Nair et al. |
| 2015/0274886 A1 | 10/2015 | Nair et al. |
| 2015/0274965 A1 | 10/2015 | Nair et al. |
| 2015/0275033 A1 | 10/2015 | Li et al. |
| 2015/0275034 A1 | 10/2015 | Li et al. |

FOREIGN PATENT DOCUMENTS

| | | | |
|---|---|---|---|
| WO | WO 2004058851 | 7/2004 | |
| WO | WO 2009009070 | 1/2009 | |
| WO | WO 2012128219 A1 * | 9/2012 | ............... C08J 5/043 |

OTHER PUBLICATIONS

Abstract of Japanese Patent—JP2004250688, Sep. 9, 2004, 2 pages.
Abstract of Japanese Patent—JP2004319929, Nov. 11, 2004, 2 pages.
Abstract of Japanese Patent—JP2005305734, Nov. 4, 2005, 2 pages.
Abstract of Japanese Patent—JP2005342980, Dec. 15, 2005, 1 page.
Abstract of Japanese Patent—JP2006117731, May 11, 2006, 1 page.
Abstract of Japanese Patent—JP2006137786, Jun. 1, 2006, 2 pages.
Abstract of Japanese Patent—JP2006176564, Jul. 6 2006, 1 page.
Abstract of Japanese Patent—JP2006188570, Jul. 20, 2006, 1 page.
Abstract of Japanese Patent—JP2006193604, Jul. 27, 2006, 1 page.
Abstract of Japanese Patent—JP2006335813, Dec. 14, 2006, 2 pages.
Abstract of Japanese Patent—JP2009280831, Dec. 3, 2009, 1 page.
Abstract of Japanese Patent—JP2010121025, Jun. 3, 2010, 1 page.
Abstract of Japanese Patent—JP2011157420, Aug. 18, 2011, 1 page.
Abstract of Japanese Patent—JP2012012467, Jan. 19, 2012, 1 page.
Abstract of WO Patent—WO2012118262, Oct. 26, 2012, 1 page.
Abstract of WO Patent—WO2012153901, Nov. 15, 2012, 1 page.
*A Guidebook to particle Size Analysis* from Horiba Scientific, 2010. 17 pages.
Article—Chen et al., "Design and Development of a Packaging Using LCP for RF/Microwave MEMS Switches," *IEEE Transac-*

(56) References Cited

OTHER PUBLICATIONS

*tions on Microwave Theory and Techniques*, vol. 54, No. 11, Nov. 2006, pp. 4009-4015.
Article—Markus Wille, "Basic Designs of Flex-Rigid Printed Circuit Boards," www.Onboard-Technology.com, *OnBoard Technology*, Jun. 2006, pp. 8-13.
Article—Tom Woznicki, "Films and Adhesives—So Many Choices," *Flex Circuit News*, Aug. 2001, pp. 1-8.
Article—Wang et al., "Liquid crystal polymer (LCP) for MEMS; processes and applications," *J. Micromech. Microeng.*, vol. 13, 2003, pp. 628-633.
Material Safety Data Sheet from Millennium Chemicals, MSDS No. 5. 12, Jan. 15, 2003, 7 pages.
Medical Design Briefs—Molded Interconnect Device Technology Enables Smaller Medical Devices, 2010, Harting, Inc., 2 pages.
Paper—Dr. Terry F. Hayden, "New Liquid Crystal Polymer (LCP) Flex Circuits to Meet Demanding Reliability and End-Use Applications Requirements," *3M Microelectroncis Systems Division*, 7 pages.
Paper—Mahapatra et al., "Low Cost, Hermetic Optical Port Using Liquid Crystal Polymer," Presented at Optoelectronics Device Packaging and Materials Topical Workshop, IMAPS, Bethlehem, PA, 2003 6 pages.
Paper—Okamoto et al., "Newly Developed LCP Film Fabricated by Solvent-Coating Method," *Sumitomo Kagaku*, vol. 2005-I, 2005, 11 pages.
Paper—R. Lusignea, "High Barrier Packaging with Liquid Crystal Polymers," 1996 *Polymers, Laminations & Coatings Conference*, TAPPI Proceedings, 1996, pp. 115-124.
Paper—Rich Trine, "Multilayer Lamination Methods for PTFE-Based PCBs," *Taconic*, 2007, 11 pages.
Paper—Sood et al., "Controlling Moisture in Printed Circuit Boards," *IPC Printed Circuit Expo, APEX & Designer Summit Proceedings*, 2011, 10 pages.
Presentation—Proposal to Flexible PCB Materials, Jun. 2008, Matsushita Electric Works, Ltd.
Press Release—LPKF and Ticona for Laser Direct Structure (LDS) with Vectra® LCP, Oct. 2003, 1 page.
Processing Guidelines for Speedboard® C Prepreg from W. L. Gore & Associates, Inc., 2007, 2 pages.
Product Data Sheet for TiONA® RCL—, Titanium Dioxide Pigment, Jun. 2009, Cristal Global.
Product Description—DuPont™ Ti-Pure® R-105, Titanium Dioxide from E. I. duPont de Nemours and Company, 2007, 2 pages.
Product Information—Vectra®—Liquid Crystal Polymer (LCP) from Ticona, 1 page (13), 2001.
Product Information on Gore® Speedboard® C Prepreg from W. L. Gore & Associates, Inc., 2012, 1 page.
Product Information on YFLEX Flexible Circuit Board from Yamaichi Electronics, Jan. 2006, 4 pages.
Product Information, Hayashi-Kasei.CO.JP, related to fillers, 2006, 2 pages.
International Search Report and Written Opinion for PCT/US2015/34150, dated Aug. 20, 2015, 15 pages.

\* cited by examiner

LASER ACTIVATABLE POLYMER COMPOSITION

RELATED APPLICATIONS

The present application claims priority to U.S. Provisional Application Ser. Nos. 62/019,561, filed on Jul. 1, 2014, and 62/040,526, filed on Aug. 22, 2014, which are incorporated herein in their entirety by reference thereto.

BACKGROUND OF THE INVENTION

Molded interconnect devices ("MID") often contain a plastic substrate on which conductive elements or pathways are formed. Such MID devices are thus three-dimensional molded parts having an integrated printed conductor or circuit layout, which saves space for use in smaller devices (e.g., cellular phones). It is becoming increasingly popular to form MIDs using a laser direct structuring ("LDS") process during which a computer-controlled laser beam travels over the plastic substrate to activate its surface at locations where the conductive path is to be situated. Various materials have been proposed for forming the plastic substrate of a laser direct structured-MID device. For example, one such material is a blend of polycarbonate, acrylonitrile butadiene styrene ("ABS"), copper chromium oxide spinel, and a bisphenol A diphenyl phosphate ("BPADP") flame retardant. One problem with such materials, however, is that the flame retardant tends to adversely impact the mechanical properties (e.g., deformation temperature under load) of the composition, which makes it difficult to use in laser direct structuring processes. Such materials are also unsuitable for lead free soldering processes (surface mount technology) that require high temperature resistance. In addition, due to surface defects on the substrate, it is often difficult to form pathways having a small and consistent spacing and width.

As such, a need exists for an improved polymer composition that can be activated by laser direct structuring.

SUMMARY OF THE INVENTION

In accordance with one embodiment of the present invention, a polymer composition is disclosed that comprises an aromatic polyester, a laser activatable additive, and a mineral filler. The mineral filler has a median size of about 35 micrometers or less and the laser activatable additive has a mean size of about 1000 nanometers or less.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
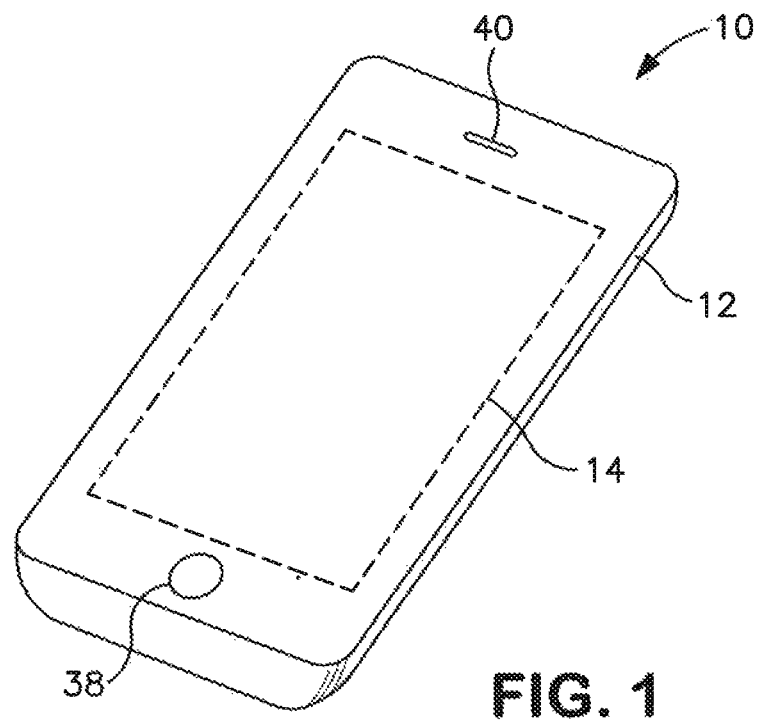
FIGS. 1-2 are respective front and rear perspective views of an electronic component that can employ a laser direct structured substrate formed according to one embodiment of the present invention.

It is to be understood by one of ordinary skill in the art that the present discussion is a description of exemplary embodiments only, and is not intended as limiting the broader aspects of the present invention.

Generally speaking, the present invention is directed to a substrate that can be provided with conductive pathways through a laser direct structuring ("LDS") process. The substrate is formed from a polymer composition that contains an aromatic polyester, mineral filler (e.g., particles, fibers, etc.), and laser-activatable additive. The mineral filler may have a median size (e.g., equivalent spherical diameter) of about 35 micrometers or less, in some embodiments from about 0.1 to about 25 micrometers, in some embodiments from about 0.5 to about 15 micrometers, and in some embodiments, from about 1 to about 5 micrometers, such as determined using by a sedigraph (e.g., Sedigraph 5100 from Micromeritics) in accordance with ASTM C958. The laser activatable additive may likewise have a mean size (e.g., diameter) of about 1000 nanometers or less, in some embodiments from about 10 to about 900 nanometers, in some embodiments from about 100 to about 800 nanometers, and in some embodiments, from about 200 to about 700 nanometers, such as determined using a laser scattering particle size distribution analyzer (e.g., Horiba LA910). The mineral filler and/or laser activatable additive may also have a narrow size distribution. That is, at least about 70% by volume, in some embodiments at least about 80% by volume, and in some embodiments, at least about 90% by volume of the filler or laser activatable additive may have a size within the ranges noted above.

Without intending to be limited by theory, the present inventors have discovered that mineral fillers and laser activatable additives having the size characteristics noted above can have a synergistic impact on the mechanical strength, adhesive strength, and surface smoothness of the resulting molded part. Among other things, this allows for conductive pathways to be formed with a reduced "pitch", which is defined as the center-to-center distance between two adjacent pathways. The pitch between conductive pathways may, for example, be from about 1 to about 1500 micrometers, in some embodiments, from about 1 to about 500 micrometers, in some embodiments, from about 2 to about 100 micrometers, in some embodiments, from about 5 to about 90 micrometers, and in some embodiments, from about 10 to about 80 micrometers. With such a fine pitch, a greater number of conductive pathways can be formed within a given area, thereby decreasing the amount of space and weight required for a particular application. The unique nature of the polymer composition may also allow for a highly consistent pathway width and/or spacing.

Various embodiments of the present invention will now be described in more detail.

I. Polymer Composition

A. Aromatic Polyester

The polymer composition of the present invention includes an aromatic polyester, which may be a thermotropic liquid crystalline polymer that contains aromatic ester repeating units generally represented by the following Formula (I):

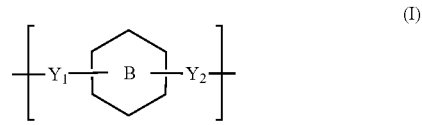

wherein, ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and $Y_1$ and $Y_2$ are independently O, C(O), NH, C(O)HN, or NHC(O), wherein at least one of $Y_1$ and $Y_2$ are C(O).

Examples of aromatic ester repeating units that are suitable for use in the present invention may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic dicarboxylic repeating units, for instance, may be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl)ether, bis(4-carboxyphenyl)butane, bis(4-carboxyphenyl)ethane, bis(3-carboxyphenyl)ether, bis(3-carboxyphenyl)ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), or 2,6-naphthalenedicarboxylic acid ("NDA"). When employed, repeating units derived from aromatic dicarboxylic acids (e.g., IA, TA, and/or NDA) typically constitute from about 1 mol. % to about 60 mol. %, in some embodiments from about 2 mol. % to about 55 mol. %, and in some embodiments, from about 10 mol. % to about 50% of the polymer.

Aromatic hydroxycarboxylic repeating units may also be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. One particularly suitable aromatic hydroxycarboxylic acid is 4-hydroxybenzoic acid ("HBA"). When employed, repeating units derived from hydroxycarboxylic acids (e.g., HBA) typically constitute from about 5 mol. % to about 80 mol. %, in some embodiments from about 10 mol. % to about 80 mol. %, and in some embodiments, from about 20 mol. % to about 70% of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic dials may include, for instance, hydroquinone ("HQ") and 4,4'-biphenol ("BP"). When employed, repeating units derived from aromatic diols (e.g., HQ and/or BP) typically constitute from about 1 mol. % to about 35 mol. %, in some embodiments from about 2 mol. % to about 30 mol. %, and in some embodiments, from about 5 mol. % to about 25% of the polymer. Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10% of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids (e.g., cyclohexane dicarboxylic acid), diols, amides, amines, etc. Of course, in other embodiments, the polymer may be "wholly aromatic" in that it lacks repeating units derived from non-aromatic (e.g., aliphatic or cycloaliphatic) monomers.

In one particular embodiment, for example, the polymer may be formed from repeating units derived from HBA and TA and/or IA, as well as various other optional constituents. The repeating units derived from HBA may constitute from about 10 mol. % to about 80 mol. %, in some embodiments from about 30 mol. % to about 75 mol. %, and in some embodiments, from about 45 mol. % to about 70 mol. % of the polymer. The repeating units derived from TA and/or IA may likewise constitute from about 5 mol. % to about 40 mol. %, in some embodiments from about 10 mol. % to about 35 mol. %, and in some embodiments, from about 15 mol. % to about 35 mol. % of the polymer. Repeating units may also be employed that are derived from BP and/or HQ in an amount from about 1 mol. % to about 30 mol. %, in some embodiments from about 2 mol. % to about 25 mol. %, and in some embodiments, from about 5 mol. % to about 20 mol. % of the polymer. Other possible repeating units may include those derived from HNA, NDA, and/or APAP. For example, repeating units derived from HNA, NDA, and/or APAP may each constitute from about 1 mol. % to about 35 mol. %, in some embodiments from about 2 mol. % to about 30 mol. %, and in some embodiments, from about 3 mol. % to about 25 mol. % when employed.

Regardless of the particular constituents and nature of the polymer, the aromatic polyester may be prepared by initially introducing the aromatic monomer(s) used to form the ester repeating units (e.g., aromatic hydroxycarboxylic acid, aromatic dicarboxylic acid, etc.) and/or other repeating units (e.g., aromatic diol, aromatic amide, aromatic amine, etc.) into a reactor vessel to initiate a polycondensation reaction. The particular conditions and steps employed in such reactions are well known, and may be described in more detail in U.S. Pat. No. 4,161,470 to Calundann; U.S. Pat. No. 5,616,680 to Linstid, III, et al.; U.S. Pat. No. 6,114,492 to Linstid, III. et al.; U.S. Pat. No. 6,514,611 to Shepherd, et al.; and WO 2004/058851 to Waggoner. The vessel employed for the reaction is not especially limited, although it is typically desired to employ one that is commonly used in reactions of high viscosity fluids. Examples of such a reaction vessel may include a stirring tank-type apparatus that has an agitator with a variably-shaped stirring blade, such as an anchor type, multistage type, spiral-ribbon type, screw shaft type, etc., or a modified shape thereof. Further examples of such a reaction vessel may include a mixing apparatus commonly used in resin kneading, such as a kneader, a roll mill, a Banbury mixer, etc.

If desired, the reaction may proceed through the acetylation of the monomers as known the art. This may be accomplished by adding an acetylating agent (e.g., acetic anhydride) to the monomers. Acetylation is generally initiated at temperatures of about 90° C. During the initial stage of the acetylation, reflux may be employed to maintain vapor phase temperature below the point at which acetic acid byproduct and anhydride begin to distill. Temperatures during acetylation typically range from between 90° C. to 150° C., and in some embodiments, from about 110° C. to about 150° C. If reflux is used, the vapor phase temperature typically exceeds the boiling point of acetic acid, but remains low enough to retain residual acetic anhydride. For example, acetic anhydride vaporizes at temperatures of about 140° C. Thus, providing the reactor with a vapor phase reflux at a temperature of from about 110° C. to about 130° C. is particularly desirable. To ensure substantially complete reaction, an excess amount of acetic anhydride may be employed. The amount of excess anhydride will vary depending upon the particular acetylation conditions employed, including the presence or absence of reflux. The use of an excess of from about 1 to about 10 mole percent of acetic anhydride, based on the total moles of reactant hydroxyl groups present is not uncommon.

Acetylation may occur in in a separate reactor vessel, or it may occur in situ within the polymerization reactor vessel. When separate reactor vessels are employed, one or more of the monomers may be introduced to the acetylation reactor and subsequently transferred to the polymerization reactor. Likewise, one or more of the monomers may also be directly introduced to the reactor vessel without undergoing pre-acetylation.

In addition to the monomers and optional acetylating agents, other components may also be included within the reaction mixture to help facilitate polymerization. For instance, a catalyst may be optionally employed, such as metal salt catalysts (e.g., magnesium acetate, tin(I) acetate, tetrabutyl titanate, lead acetate, sodium acetate, potassium acetate, etc.) and organic compound catalysts (e.g., N-methylimidazole). Such catalysts are typically used in amounts of from about 50 to about 500 parts per million based on the total weight of the recurring unit precursors. When separate reactors are employed, it is typically desired to apply the catalyst to the acetylation reactor rather than the polymerization reactor, although this is by no means a requirement.

The reaction mixture is generally heated to an elevated temperature within the polymerization reactor vessel to initiate melt polycondensation of the reactants. Polycondensation may occur, for instance, within a temperature range of from about 210° C. to about 400° C., and in some embodiments, from about 250° C. to about 350° C. For instance, one suitable technique for forming the aromatic polyester may include charging precursor monomers and acetic anhydride into the reactor, heating the mixture to a temperature of from about 90° C. to about 150° C. to acetylize a hydroxyl group of the monomers (e.g., forming acetoxy), and then increasing the temperature to a temperature of from about 210° C. to about 400° C. to carry out melt polycondensation. As the final polymerization temperatures are approached, volatile byproducts of the reaction (e.g., acetic acid) may also be removed so that the desired molecular weight may be readily achieved. The reaction mixture is generally subjected to agitation during polymerization to ensure good heat and mass transfer, and in turn, good material homogeneity. The rotational velocity of the agitator may vary during the course of the reaction, but typically ranges from about 10 to about 100 revolutions per minute ("rpm"), and in some embodiments, from about 20 to about 80 rpm. To build molecular weight in the melt, the polymerization reaction may also be conducted under vacuum, the application of which facilitates the removal of volatiles formed during the final stages of polycondensation. The vacuum may be created by the application of a suctional pressure, such as within the range of from about 5 to about 30 pounds per square inch ("psi"), and in some embodiments, from about 10 to about 20 psi.

Following melt polymerization, the molten polymer may be discharged from the reactor, typically through an extrusion orifice fitted with a die of desired configuration, cooled, and collected. Commonly, the melt is discharged through a perforated die to form strands that are taken up in a water bath, pelletized and dried. The resin may also be in the form of a strand, granule, or powder. While unnecessary, it should also be understood that a subsequent solid phase polymerization may be conducted to further increase molecular weight. When carrying out solid-phase polymerization on a polymer obtained by melt polymerization, it is typically desired to select a method in which the polymer obtained by melt polymerization is solidified and then pulverized to form a powdery or flake-like polymer, followed by performing solid polymerization method, such as a heat treatment in a temperature range of 200° C. to 350° C. under an inert atmosphere (e.g., nitrogen).

B. Laser Activatable Additive

As indicated above, the polymer composition of the present invention is "laser activatable" in the sense that it contains an additive that may be activated by a laser direct structuring ("LDS") process. In such a process, activation with a laser may cause a physio-chemical reaction in which the additive is cracked open to release metal atoms. These metal atoms can act as a nuclei for metallization (e.g., reductive copper coating). The laser thus draws the pattern of conductive elements onto the substrate and leaves behind a roughened surface containing embedded metal particles. These particles act as nuclei for the crystal growth during a subsequent electroless plating process (e.g., copper plating, gold plating, nickel plating, silver plating, zinc plating, tin plating, etc.).

To help accomplish these functions, the laser activatable additive may include spinel crystals, which may include two or more metal oxide cluster configurations within a definable crystal formation. For example, the overall crystal formation may have the following general formula:

$$AB_2O_4$$

wherein,
A is a metal cation having a valance of 2, such as cadmium, chromium, manganese, nickel, zinc, copper, cobalt, iron, magnesium, tin, palladium, titanium, etc., as well as combinations thereof; and
B is a metal cation having a valance of 3, such as chromium, iron, aluminum, nickel, manganese, tin, etc., as well as combinations thereof.

Typically, A in the formula above provides the primary cation component of a first metal oxide cluster and B provides the primary cation component of a second metal oxide cluster. These oxide clusters may have the same or different structures. In one embodiment, for example, the first metal oxide cluster has a tetrahedral structure and the second metal oxide cluster has an octahedral cluster. Regardless, the clusters may together provide a singular identifiable crystal type structure having heightened susceptibility to electromagnetic radiation. Examples of suitable spinel crystals include, for instance, $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, FeCr$_2$O$_4$, MgCr$_2$O$_4$, etc. Copper chromium oxide (CuCr$_2$O$_4$), also known as copper chromite, is particularly suitable for use in the present invention.

C. Mineral Filler

The polymer composition of the present invention also contains a mineral filler, which may be in the form of particles (e.g., platelet-shaped, flake-shaped, etc.), fibers, and so forth. In one embodiment, for example, the mineral filler may include silicate fillers, which may be in the form of particles. Some examples of suitable silicate fillers include, for instance, talc, halloysite, kaolinite, illite, montmorillonite, vermiculite, palygorskite, pyrophyllite, mica, diatomaceous earth, etc., as well as combinations thereof. Mica and/or talc may be particularly suitable. In one particular embodiment, for example, talc particles may be employed that have a median size (e.g., equivalent spherical diameter) of about 10 micrometers or less, in some embodiments from about 0.5 to about 8 micrometers, and in some embodiments, from about 1 to about 5 micrometers, such as determined using a sedigraph in accordance with ASTM C958. Besides silicates, other suitable mineral filler particles may include carbonates, such as calcium carbonate (CaCO$_3$) or a copper carbonate hydroxide (Cu$_2$CO$_3$(OH)$_2$); fluorides, such as calcium fluoride (CaFl$_2$); phosphates, such as calcium pyrophosphate (Ca$_2$P$_2$O$_7$), anhydrous dicalcium phosphate (CaHPO$_4$), or hydrated aluminum phosphate (AlPO$_4$.2H$_2$O); glass (e.g., glass powder); etc.

Mineral fibers (also known as "whiskers") may also be employed as a mineral filler in the polymer composition. Examples of such mineral fibers include those that are derived from silicates, such as neosilicates, sorosilicates, inosilicates (e.g., calcium inosilicates, such as wollastonite; calcium magnesium inosilicates, such as tremolite; calcium magnesium iron inosilicates, such as actinolite; magnesium iron inosilicates, such as anthophyllite; etc.), phyllosilicates (e.g., aluminum phyllosilicates, such as palygorskite), tectosilicates, etc.; sulfates, such as calcium sulfates (e.g., dehydrated or anhydrous gypsum); mineral wools (e.g., rock or slag wool); glass; and so forth. Particularly suitable are inosilicates, such as wollastonite fibers available from Nyco Minerals under the trade designation NYGLOS® (e.g., NYGLOS® 4W, NYGLOS® 5, or NYGLOS® 8). In addition to possessing the size characteristics noted above, the mineral fibers may also have a relatively high aspect ratio (average length divided by median width) to help further improve the mechanical properties and surface quality of the resulting polymer composition. For example, the mineral fibers may have an aspect ratio of from about 1 to about 50, in some embodiments from about 2 to about 20, and in some embodiments, from about 4 to about 15. The volume average length of such mineral fibers may, for example, range from about 1 to about 200 micrometers, in some embodiments from about 2 to about 150 micrometers, in some embodiments from about 5 to about 100 micrometers, and in some embodiments, from about 10 to about 50 micrometers.

In certain embodiments, the mineral filler may have a relatively high hardness value, such as about 2.5 or more, in some embodiments about 3.0 or more, in some embodiments from about 3.5 to about 11.0, and in some embodiments, from about 4.5 to about 6.5, based on the Mohs hardness scale. Example of fillers having a relatively high hardness value may include, for instance, calcium pyrophosphate (Ca$_2$P$_2$O$_7$, Mohs hardness of 5.0), anhydrous dicalcium phosphate (CaHPO$_4$, Mohs hardness of 3.5), or hydrated aluminum phosphate (AlPO$_4$.2H$_2$O, Mohs hardness of 4.5). Through the use of such fillers, the resulting polymer composition may also have a relatively high hardness value. For example, the composition may have a Rockwell hardness value of about 45 or more, in some embodiments about 50 or more, in some embodiments from about 50 to about 100, and in some embodiments, from about 55 to about 80, as determined in accordance with ISO 2039-2, Scale M (technical equivalent of ASTM D785-08). Thus, through the use of such a high hardness value, the present inventors have discovered that the resulting polymer composition is able to achieve less delamination on substrates to which it is applied. Such fillers can also improve mechanical strength and surface smoothness of the resulting part.

The relative amount of the mineral filler in the polymer composition may be selectively controlled to help achieve the desired mechanical properties without adversely impacting other properties of the composition, such as its smoothness when formed into a molded part. For example, the mineral filler typically constitutes from about 10 wt % to about 70 wt. %, in some embodiments from about 20 wt. % to about 60 wt. %, and in some embodiments, from about 30 wt. % to about 50 wt. % of the polymer composition. Laser activatable additives may likewise constitute from about 0.1 wt. % to about 30 wt. %, in some embodiments from about 0.5 wt. % to about 20 wt. %, and in some embodiments, from about 1 wt. % to about 10 wt. % of the polymer composition. Aromatic polyesters also typically constitute from about 20 wt. % to about 80 wt. %, in some embodiments from about 30 wt. % to about 75 wt. %, and in some embodiments, from about 40 wt. % to about 70 wt. % of the polymer composition.

D. Optional Additives

If desired, the composition may optionally contain one or more other additives if so desired, such as fibers, flow aids, antimicrobials, pigments, antioxidants, stabilizers, surfactants, waxes, solid solvents, flame retardants, anti-drip additives, and other materials added to enhance properties and processability. Fibers may, for instance, be employed to further improve mechanical properties. To help maintain an insulating property, which is often desirable for use in electronic applications, the fibers may be formed from materials that are also generally insulating in nature, such as aramids (e.g., Kevlar® marketed by E. I. du Pont de Nemours, Wilmington, Del.), polyolefins, polyesters, etc., as well as mixtures thereof.

Lubricants may also be employed in the polymer composition that are capable of withstanding the processing conditions of the aromatic polyester without substantial decomposition. Examples of such lubricants include fatty acids esters, the salts thereof, esters, fatty acid amides, organic phosphate esters, and hydrocarbon waxes of the type commonly used as lubricants in the processing of engineering plastic materials, including mixtures thereof. Suitable fatty acids typically have a backbone carbon chain of from about 12 to about 60 carbon atoms, such as myristic acid, palmitic acid, stearic acid, arachic acid, montanic acid, octadecinic acid, parinric acid, and so forth. Suitable esters include fatty acid esters, fatty alcohol esters, wax esters, glycerol esters, glycol esters and complex esters. Fatty acid amides include fatty primary amides, fatty secondary amides, methylene and ethylene bisamides and alkanolamides such as, for example, palmitic acid amide, stearic acid amide, oleic acid amide, N,N'-ethylenebisstearamide and so forth. Also suitable are the metal salts of fatty acids such as calcium stearate, zinc stearate, magnesium stearate, and so forth; hydrocarbon waxes, including paraffin waxes, polyolefin and oxidized polyolefin waxes, and microcrystalline waxes. Particularly suitable lubricants are acids, salts, or amides of stearic acid, such as pentaerythritol tetrastearate, calcium stearate, or N,N'-ethylenebisstearamide. When employed, the lubricant(s) typically constitute from about 0.05 wt. % to about 1.5 wt. %, and in some embodiments, from about 0.1 wt. % to about 0.5 wt. % (by weight) of the polymer composition.

The melt viscosity of the resulting polymer composition is generally low enough so that it can readily flow into spaces (e.g., mold cavity) having small dimensions. For example, in one particular embodiment, the polymer composition may have a melt viscosity of from about 0.5 to about 100 Pa-s, in some embodiments from about 1 to about 80 Pa-s, and in some embodiments, from about 5 to about 50 Pa-s, determined at a shear rate of 1000 seconds$^{-1}$. Melt viscosity may be determined in accordance with ASTM Test No, 1238-70 at a temperature of 350° C.

To help achieve the desired melt viscosity, one or more functional compounds may be employed as flow modifiers that interact with the aromatic polyester to reduce its melt viscosity. The functional compounds used herein may be mono-, di-, tri-functional, etc., and may contain one or more reactive functional groups, such as hydroxyl, carboxyl, carboxylate, ester, and primary or secondary amines. Hydroxy-functional compounds are particularly suitable flow modifiers as they contain hydroxyl functional groups that can react with the polymer chain to shorten its length and thus reduce melt viscosity. When employed, such hydroxy-functional compounds typically constitute from about 0.05 wt. % to about 4 wt. % of the polymer composition. One example of such a hydroxyl-functional compound is an aromatic diol, such as hydroquinone, resorcinol, 4,4'-biphenol, etc., as well as combinations thereof. Such aromatic diols may constitute from about 0.01 wt. % to about 1 wt. %, and in some embodiments, from about 0.05 wt. % to about 0.4 wt. % of the polymer composition. Water is also a suitable hydroxyl-functional compound, and can be used alone or in combination with other hydroxyl-functional compounds. If desired, water can be added in a form that under process conditions generates water. For example, the water can be added as a hydrate that under the process conditions (e.g., high temperature) effectively "loses" water. Such hydrates include alumina trihydrate, copper sulfate pentahydrate, barium chloride dihydrate, calcium sulfate dehydrate, etc., as well as combinations thereof. When employed, the hydrates may constitute from about 0.02 wt. % to about 2 wt. %, and in some embodiments, from about 0.05 wt. % to about 1 wt. % of the polymer composition.

In addition to those noted above, still other functional compounds may also be employed as flow modifiers in the polymer composition. For instance, aromatic dicarboxylic acids can be employed that generally act to combine smaller chains of the polymer together after they have been cut by other types of functional compounds. This maintains the mechanical properties of the composition even after its melt viscosity has been reduced. Suitable aromatic dicarboxylic acids for this purpose may include, for instance, terephthalic acid, 2,6-napthalenedicarboxylic acid, isophthalic acid, 4,4'-bibenzoic acid, 2-methylterephthalic acid, etc., as well as combinations thereof. When employed, such dicarboxylic acids typically constitute from about 0.001 wt. % to about 0.5 wt. %, and in some embodiments, from about 0.005 wt. % to about 0.1 wt. % of the polymer composition. In one particular embodiment, the polymer composition of the present invention employs a mixture of an aromatic diol, hydrate, and aromatic dicarboxylic acid. This specific combination of ingredients can reduce melt viscosity and improve flow, but without having an adverse impact on mechanical properties. Typically, of the flow modifiers employed in the polymer composition, aromatic dials constitute from about 15 wt. % to about 45 wt. %, hydrates constitutes from about 45 wt. % to about 75 wt. %, and aromatic dicarboxylic acids constitute from about 1 wt. % to about 15 wt. %.

The melting temperature of the composition may likewise be from about 250° C. to about 400° C., in some embodiments from about 270° C. to about 380° C., and in some embodiments, from about 300° C. to about 360° C. The melting temperature may be determined as is well known in the art using differential scanning calorimetry ("DSC"), such as determined by ISO Test No. 11357. Even at such melting temperatures, the ratio of the deflection temperature under load ("DTUL"), a measure of short term heat resistance, to the melting temperature may still remain relatively high. For example, the ratio may range from about 0.65 to about 1.00, in some embodiments from about 0.66 to about 0.95, and in some embodiments, from about 0.67 to about 0.85. The specific DTUL values may, for instance, range from about 200° C. to about 300° C., in some embodiments from about 210° C. to about 280° C., and in some embodiments, from about 215° C. to about 260° C. Such high DTUL values can, among other things, allow the use of high speed infrared soldering process to surface mount electronic components onto the LDS substrate.

II. Substrate

Once formed, the polymer composition may be shaped into a variety of different types of substrates, such as sheets, films, molded parts, etc. Suitable shaping techniques may include, for instance, molding (e.g., injection molding, compression molding, etc.), profile extrusion, film or sheet forming, thermoforming, etc. In one embodiment, for instance, the substrate may be molded using a one-component injection molding process in which dried and preheated plastic granules are injected into the mold. Regardless of how it is formed, the substrate is typically thin in nature and may, for instance, have a thickness of about 5 millimeters or less, in some embodiments from about 0.1 to about 3 millimeters, in some embodiments from about 0.2 to about 2 millimeters, and in some embodiments, from about 0.5 to about 1 millimeter.

Despite its small size, the substrate may nevertheless possess excellent mechanical properties. For example, the substrate may exhibit a high impact strength, which is useful when forming small parts. The composition may, for instance, possess a Charpy notched impact strength greater than about 4 kJ/m$^2$, in some embodiments from about 4.5 to about 30 kJ/m$^2$, and in some embodiments, from about 5 to about 20 kJ/m$^2$, measured at 23° C. according to ISO Test No. 179-1) (technically equivalent to ASTM D256, Method B). The tensile and flexural mechanical properties of the substrate are also good. For example, the substrate may exhibit a tensile strength of from about 20 to about 500 MPa, in some embodiments from about 50 to about 400 MPa, and in some embodiments, from about 100 to about 350 MPa; a tensile break strain of about 0.5% or more, in some embodiments from about 0.6% to about 10%, and in some embodiments, from about 0.8% to about 3.5%; and/or a tensile modulus of from about 5,000 MPa to about 20,000 MPa, in some embodiments from about 8,000 MPa to about 20,000 MPa, and in some embodiments, from about 10,000 MPa to about 15,000 MPa. The tensile properties may be determined in accordance with ISO Test No. 527 (technically equivalent to ASTM D638) at 23° C. The substrate may also exhibit a flexural strength of from about 20 to about 500 MPa, in some embodiments from about 50 to about 400 MPa, and in some embodiments, from about 100 to about 350 MPa; a flexural break strain of about 0.5% or more, in some embodiments from about 0.6% to about 10%, and in some embodiments, from about 0.8% to about 3.5%; and/or a flexural modulus of from about 5,000 MPa to about 20,000 MPa, in some embodiments from about 8,000 MPa to about 20,000 MPa, and in some embodiments, from about 10,000 MPa to about 15,000 MPa. The flexural properties may be determined in accordance with ISO Test No. 178 (technically equivalent to ASTM D790) at 23° C.

Figure 3:
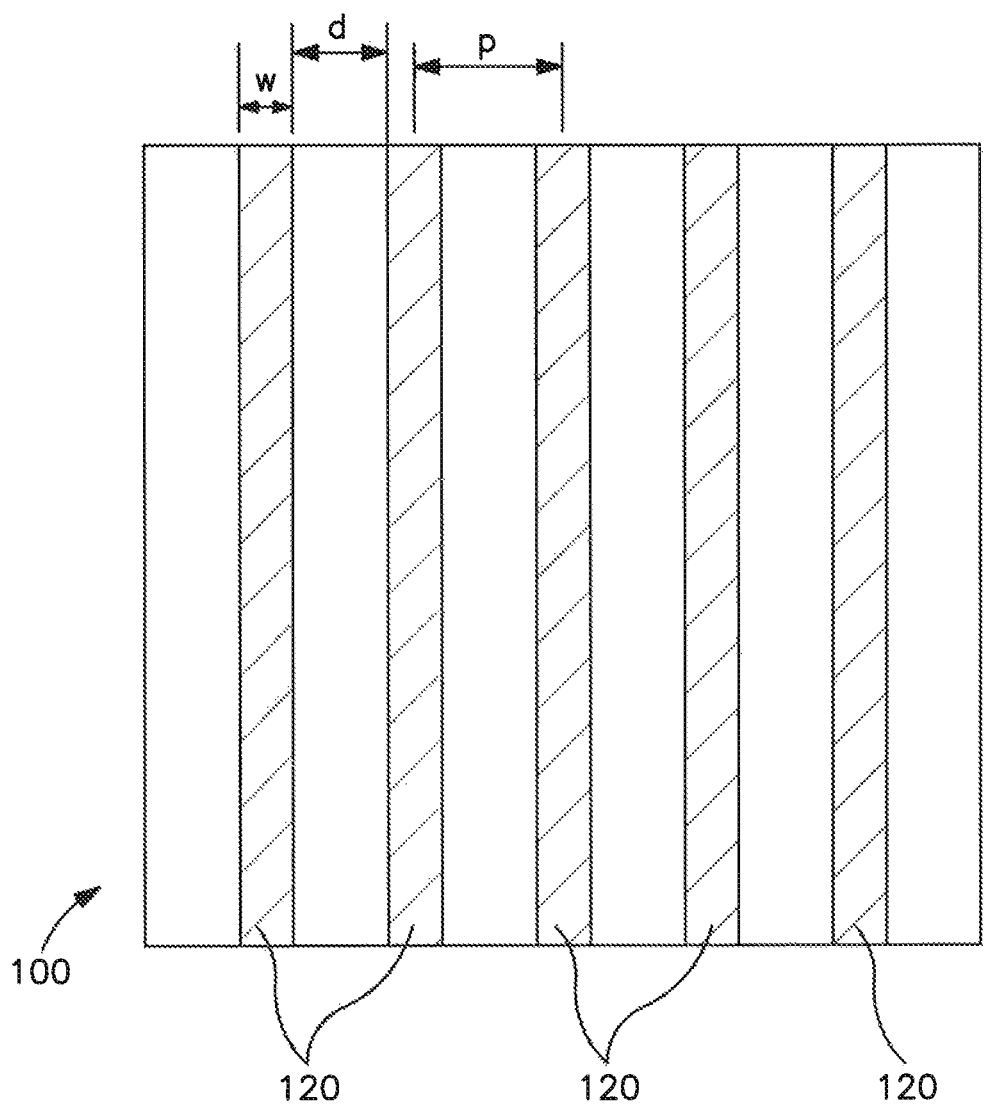
FIG. 3 is a schematic top view of one embodiment of the substrate of the present invention on which conductive pathways have been formed by a laser direct structuring process.

As indicated above, conductive pathways may be formed on the substrate using a laser direct structuring process. The number of pathways may vary depending on the particular application, but typically, at least two conductive pathways are disposed on the substrate, such as from 2 to 100, in some embodiments from 3 to 50, and in some embodiments, from 4 to 25. Referring to FIG. 3, for example, one embodiment of a substrate 100 is shown in which multiple conductive pathways 120 are disposed and aligned in a longitudinal direction "L." Due to the unique nature of the polymer composition of the present invention, the present inventors have discovered that the width and spacing of the conductive pathways may be very small, which provides a variety of benefits as noted above. For example, one or more of the conductive pathways 120 have a certain width "w", which is typically from about 1 to about 50 micrometers, in some embodiments, from about 2 to about 40 micrometers, and in some embodiments, from about 5 to about 35 micrometers. Likewise, at least two of the pathways 120 are spaced apart a certain distance "d", which is also typically from about 1 to about 80 micrometers, from about 1 to about 50 micrometers, in some embodiments, from about 2 to about 40 micrometers, and in some embodiments, from about 5 to about 35 micrometers. The center-to-center spacing "p" (or pitch) between the pathways may also be from about 1 to about 1500 micrometers, in some embodiments from about 1 to about 500 micrometers, in some embodiments from about 2 to about 100 micrometers, in some embodiments from about 5 to about 90 micrometers, and in some embodiments, from about 10 to about 80 micrometers. With such a fine pitch, a greater number of conductive pathways can be formed within a given area, thereby increasing efficiency and reducing costs.

III. Applications

Figure 2:
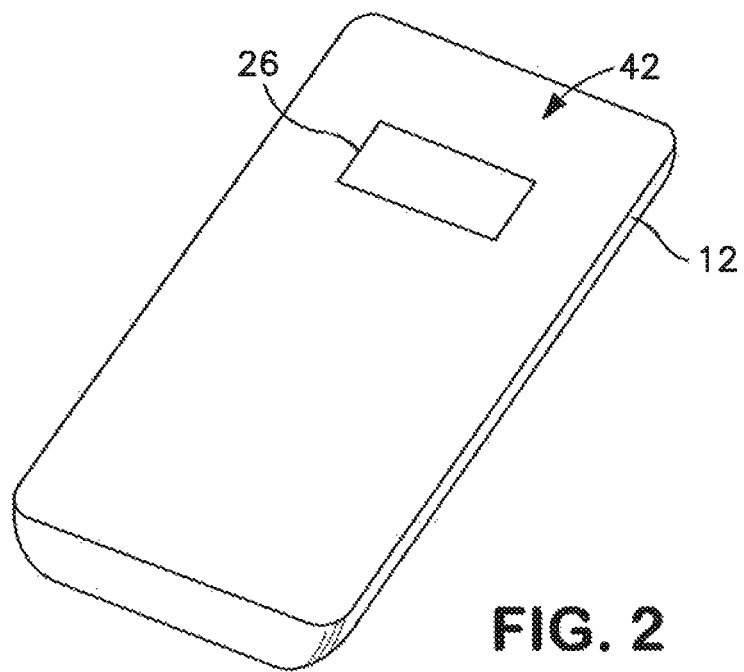

The polymer composition and substrate may be used in a wide variety of different parts having a small dimensional tolerance. For example, the part may be a molded interconnect device ("MID") or part in that it contains integrated electronic circuit conductive elements. One example of such a part is one in which the conductive elements form antennas of a variety of different types, such as antennae with resonating elements that are formed from patch antenna structures, inverted-F antenna structures, closed and open slot antenna structures, loop antenna structures, monopoles, dipoles, planar inverted-F antenna structures, hybrids of these designs, etc. One particularly suitable electronic component is shown in FIGS. 1-2 is a handheld device 10 with cellular telephone capabilities. As shown in FIG. 1, the device 10 may have a housing 12 formed from plastic, metal, other suitable dielectric materials, other suitable conductive materials, or combinations of such materials. A display 14 may be provided on a front surface of the device 10, such as a touch screen display. The device 10 may also have a speaker port 40 and other input-output ports. One or more buttons 38 and other user input devices may be used to gather user input. As shown in FIG. 2, an antenna structure 26 is also provided on a rear surface 42 of device 10, although it should be understood that the antenna structure can generally be positioned at any desired location of the device. The antenna structure may be electrically connected to other components within the electronic device using any of a variety of known techniques. Referring again to FIGS. 1-2, for example, the housing 12 or a part of housing 12 may serve as a conductive ground plane for the antenna structure 26.

Due to its unique properties, the molded part of the present invention may be employed in a wide variety of different electronic components. As an example, the molded part may be formed in electronic components, such as desktop computers, portable computers, handheld electronic devices, etc. In one suitable configuration, the part is formed in the housing of a relatively compact portable electronic component in which the available interior space is relatively small. Examples of suitable portable electronic components include cellular telephones, laptop computers, small portable computers (e.g., ultraportable computers, netbook computers, and tablet computers), wrist-watch devices, pendant devices, headphone and earpiece devices, media players with wireless communications capabilities, handheld computers (also sometimes called personal digital assistants), remote controllers, global positioning system (GPS) devices, handheld gaming devices, etc. The part could also be integrated with other components such as camera module, speaker or battery cover of a handheld device.

In certain embodiments, the substrate may be employed in the base, barrel, actuator, etc. of a camera module. For example, in one embodiment, the camera module may contain a lens assembly that overlies a base. The base, in turn, may overly an optional main circuit board. Due to their relatively thin nature, the base and/or main circuit board are particularly suited to be formed from the substrate of the present invention as described above. The lens assembly may have any of a variety of configurations as is known in the art, and may include fixed focus-type lenses and/or auto focus-type lenses. In one embodiment, for example, the lens assembly may be in the form of a hollow barrel that houses lenses, which are in communication with an image sensor positioned on the main circuit board and controlled by a circuit. The barrel may have any of a variety of shapes, such as rectangular, cylindrical, etc. In certain embodiments, the barrel may also be formed from the substrate of the present invention. It should be understood that other parts of the camera module may also be formed from the substrate of the present invention.

Apart from those referenced above, the molded part of the present invention may also be employed in a wide variety of other components, such as implantable medical devices. For example, the implantable medical device may be an active device, such as neurostimulators that are configured to provide a stimulation signal (e.g., therapeutic signal) to the central nervous system and/or peripheral nervous system, cardiac pacemakers or defibrillators, etc. Electrical neurostimulation may be provided by implanting an electrical device underneath the patient's skin and delivering an electrical signal to a nerve, such as a cranial nerve. The electrical signal may be applied by an implantable medical device that is implanted within the patient's body. In another alternative embodiment, the signal may be generated by an external pulse generator outside the patient's body, coupled by an RF or wireless link to an implanted electrode.

The present invention may be better understood with reference to the following examples.

Test Methods

Melt Viscosity:

The melt viscosity (Pa-s) was determined in accordance with ISO Test No. 11443 at 350° C. and at a shear rate of 1000 s$^{-1}$ using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm±0.005 mm and the length of the rod was 233.4 mm.

Melting Temperature:

The melting temperature ("Tm") was determined by differential scanning calorimetry ("DSC") as is known in the art. The melting temperature is the differential scanning calorimetry (DSC) peak melt temperature as determined by ISO Test No. 11357. Under the DSC procedure, samples were heated and cooled at 20° C. per minute as stated in ISO Standard 10350 using DSC measurements conducted on a TA Q2000 Instrument.

Deflection Temperature Under Load ("DTUL"):

The deflection under load temperature was determined in accordance with ISO Test No. 75-2 (technically equivalent to ASTM D648-07). More particularly, a test bar sample having a length of 80 mm, thickness of 4 mm, and width of 10 mm was subjected to an edgewise three-point bending test in which the specified load (maximum outer fibers stress) was 1.8 Megapascals. The specimen was lowered into a silicone oil bath where the temperature is raised at 2° C. per minute until it deflects 0.25 mm (0.32 mm for ISO Test No. 75-2).

Tensile Modulus, Tensile Stress, and Tensile Elongation:

Tensile properties are tested according to ISO Test No. 527 (technically equivalent to ASTM D638). Modulus and strength measurements are made on the same test strip sample having a length of 80 mm, thickness of 4 mm, and width of 10 mm. The testing temperature is 23° C., and the testing speeds are 1 or 5 mm/min.

Flexural Modulus and Flexural Stress:

Flexural properties are tested according to ISO Test No. 178 (technically equivalent to ASTM D790). This test is performed on a 64 mm support span. Tests are run on the center portions of uncut ISO 3167 multi-purpose bars. The testing temperature is 23° C. and the testing speed is 2 mm/min.

Notched Charpy Impact Strength:

Notched Charpy properties are tested according to ISO Test No, ISO 179-1) (technically equivalent to ASTM D256, Method B). This test is run using a Type A notch (0.25 mm base radius) and Type 1 specimen size (length of 80 mm, width of 10 mm, and thickness of 4 mm). Specimens are cut from the center of a multi-purpose bar using a single tooth milling machine. The testing temperature is 23° C.

Example 1

A polymer composition is formed from 41.5 wt. % of a first liquid crystalline polymer, 20 wt. % of masterbatch containing a second liquid crystalline polymer (14 wt. % of the total composition) and a copper chromite additive (6.0 wt. % of the total composition), and 38.5 wt. % talc. The first and second liquid crystalline polymers are formed from 4-hydroxybenzoic acid ("HBA"), 2,6-hydroxynaphthoic acid ("HNA"), terephthalic acid ("TA"), 4,4'-biphenol ("BP"), and acetaminophen ("APAP"), such as described in U.S. Pat. No. 5,508,374 to Lee, et al. The copper chromite additive is Dynamix Black 30C965 (Shepherd Color), which has a mean size of 0.6 micrometers as determined using a laser scattering particle size distribution analyzer (e.g., Horiba LA910). The talc is HTP-4 (ImiFabi), which has a median size of 7.0 micrometers as determined with a Sedigraph 5100.

Example 2

A polymer composition is formed from 41.5 wt. % of a first liquid crystalline polymer, 20 wt. % of masterbatch containing a second liquid crystalline polymer (14 wt. % of the total composition) and a copper chromite additive (6.0 wt. % of the total composition), and 38.5 wt. % talc. The liquid crystalline polymers and copper chromite additive are the same as described in Example 1. The talc is JETFIL 575C (Imerys), which has a median size of 3.4 micrometers as determined with a Sedigraph 5100.

Parts are injection molded from the compositions of Examples 1-2 and tested for thermal and mechanical properties as described above. The results are set forth below.

| Property | Example 1 | Example 2 |
|---|---|---|
| Melt Viscosity (Pa-s) at 350° C. | 51 | 50 |
| Tensile Strength (MPa) | 96 | 105 |
| Strain at Break (%) | 2.3 | 3.0 |
| Tensile Modulus (MPa) | 10,200 | 10,400 |
| Flexural Strength (MPa) | 118 | 120 |
| Flexural Modulus (MPa) | 11,000 | 10,900 |
| Notched Charpy Impact Strength (kJ/m$^2$) | 4.6 | 5.5 |
| DTUL (° C.) | 228 | 229 |

Examples 3-8

A polymer composition is formed from various percentages of a liquid crystalline polymer, copper chromite additive, talc, calcium pyrophosphate, glass powder, calcium sulfate, and/or NYGLOS® 5. The liquid crystalline polymers and copper chromite additive are the same as described in Example 1. The calcium pyrophosphate (Ca$_2$P$_2$O$_7$, Taihei Chemical) has a median particle diameter of 5.0 μm, as determined by laser scattering (Horiba LA-750). NYGLOS® 5 (Nyco Minerals) is a wollastonite fiber with an average length of 60 μm, nominal aspect ratio of 13 to 1, and a median particle size of 4.7 μm, as measured on a sedigraph. The calcium sulfate (US Gypsum) has an average particle size of 4.0 μm. The glass powder is PF70E-00 (Nitto Boseki) and has an average fiber length of 60 μm and particle size of 10.5 μm. The details of each sample are provided below.

| Example | 3 | 4 | 5 | 6 | 7 | 8 |
|---|---|---|---|---|---|---|
| LCP (wt. %) | 55.50 | 55.50 | 55.50 | 55.50 | 55.50 | 59.00 |
| Copper Chromite (wt. %) | 6.00 | 6.00 | 6.00 | 6.00 | 6.00 | 6.00 |
| Talc (JETFIL 575C) | 38.50 | — | — | — | — | — |
| Talc (HTP-4) | — | 38.50 | — | — | — | — |
| Calcium Pyrophospate (wt. %) | — | — | 38.50 | — | — | 20.00 |
| Glass Powder (wt. %) | — | — | — | 38.50 | — | — |
| Anhydrous Calcium Sulfate (wt. %) | — | — | — | — | 38.50 | — |
| NYGLOS ® 5 (wt. %) | — | — | — | — | — | 15.00 |

All the samples listed in the table below were compounded on a 32 mm twin screw extruder with 10 barrel sections screw design. The talc, calcium pyrophosphate, glass powder, and calcium sulfate are added in barrel 4 downstream of the polymer melt section, while NYGLOS® 5 is added in barrel 6.

Parts are injection molded from the compositions of Examples 3-8 and tested for thermal and mechanical properties as described above. The results are set forth below.

| Example | 3 | 4 | 5 | 6 | 7 | 8 |
|---|---|---|---|---|---|---|
| Melt Viscosity (Pa-s) at 350° C. | 59 | 48 | 87 | 66 | 67 | 67 |
| Tensile Strength (MPa) | 94 | 95 | 101 | 137 | 101 | 123 |
| Strain at Break (%) | 2.1 | 2.5 | 3.1 | 2.6 | 2.2 | 2.5 |
| Tensile Modulus (MPa) | 10,670 | 10,286 | 9,317 | 14,633 | 9,391 | 11,915 |
| Flexural Strength (MPa) | 119 | 120 | 130 | 177 | 121 | 151 |
| Flexural Modulus (MPa) | 11,481 | 11,392 | 9,532 | 14,913 | 9,914 | 12,284 |
| Notched Charpy Impact Strength (kJ/m$^2$) | 3.3 | 3.9 | 6.4 | 18.4 | 3.2 | 6.8 |
| DTUL (° C.) | 227 | 224 | 222 | 246 | 216 | 232 |
| Rockwell Hardness Value (Scale M) | 42.6 | 44.0 | 62.7 | 57.6 | 66.2 | 54.8 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A polymer composition comprising from about 40 wt % to about 80 wt. % of an aromatic polyester, from about 1 wt. % to about 10 wt. % of a laser activatable additive that includes spinel crystals, and from about 20 wt. % to about 60 wt. % of a mineral filler that includes talc particles, wherein the talc particles have a median size of about 35 micrometers or less and the spinel crystals have a mean size of from about 100 to about 800 nanometers.

2. The polymer composition of claim 1, wherein at least about 70% by volume of the mineral filler has a size of about 35 micrometers or less and/or at least about 70% by volume of the laser activatable additive has a size of about from about 100 to about 800 nanometers.

3. The polymer composition of claim 1, wherein the aromatic polyester is a liquid crystalline polymer.

4. The polymer composition of claim 1, wherein the aromatic polyester contains aromatic ester repeating units, the aromatic ester repeating units including aromatic dicarboxylic acid repeating units and aromatic hydroxycarboxylic acid repeating units.

5. The polymer composition of claim 4, wherein the aromatic hydroxycarboxylic acid repeating units are derived from 4-hydroxybenzoic acid, 6-hydroxy-2-naphthoic acid, or a combination thereof and/or the aromatic dicarboxylic acid repeating units are derived from terephthalic acid, isophthalic acid, 2,6-naphthalenedicarboxylic acid, or a combination thereof.

6. The polymer composition of claim 5, wherein the aromatic polyester further contains hydroquinone, 4,4'-biphenol, acetaminophen, or a combination thereof.

7. The polymer composition of claim 1, wherein the aromatic polyester is wholly aromatic.

8. The polymer composition of claim 1, wherein the crystal has the following general formula AB$_2$O$_4$ wherein, A is a metal cation having a valance of 2; and B is a metal cation having a valance of 3.

9. The polymer composition of claim 8, wherein the spinel crystal is MgAl$_2$O$_4$, ZnAl$_2$O$_4$, FeAl$_2$O$_4$, CuFe$_2$O$_4$, CuCr$_2$O$_4$, MnFe$_2$O$_4$, NiFe$_2$O$_4$, TiFe$_2$O$_4$, FeCr$_2$O$_4$, MgCr$_2$O$_4$, or a combination thereof.

10. The polymer composition of claim 1, wherein the talc particles have a median size of about 10 micrometers or less.

11. The polymer composition of claim 1, wherein the mineral filler further includes calcium pyrophosphate.

12. The polymer composition of claim 1, wherein the mineral filler further includes wollastonite fibers.

13. The polymer composition of claim 1, wherein the mineral filler has a Mohs hardness value of about 2.5 or more.

14. The polymer composition of claim 1, wherein the composition has a Rockwell hardness value of about 45 or more, as determined in accordance with ISO 2039-2, Scale M.

15. A substrate comprising the polymer composition according to claim 1.

16. The substrate of claim 15, wherein the substrate is injection molded.

17. The substrate of claim 15, wherein conductive pathways are disposed on a surface of the substrate.

18. The substrate of claim 17, wherein at least one of the conductive pathways has a width from about 1 to about 50 micrometers.

19. The substrate of claim 17, wherein at least two conductive pathways are spaced apart by a distance of from about 1 to about 80 micrometers.

20. The substrate of claim 17, wherein the pitch between at least two conductive pathways is from about 1 to about 1500 micrometers.

21. A molded interconnect device comprising the substrate of claim 15.

22. A camera module comprising the substrate of claim 15.

23. The polymer composition of claim 1, wherein the composition is free of glass fibers.

24. The polymer composition of claim 1, wherein the talc particles have a median size of from about 1 micrometer to about 5 micrometers.

25. The polymer composition of claim 1, wherein the spinel crystals have a mean particle size of from about 200 nanometers to about 700 nanometers.

* * * * *